United States Patent [19]

Merchant et al.

[11] Patent Number: 5,246,617
[45] Date of Patent: Sep. 21, 1993

[54] AZEOTROPIC COMPOSITIONS OF 1,1-DICHLORO-1-FLUOROETHANE AND METHANOL/ETHANOL

[75] Inventors: Abid N. Merchant, Wilmington, Del.; Akimichi Yokozeki, Winston-Salem, N.C.

[73] Assignee: E. I. Du Pont de Nemours and Company, Wilmington, Del.

[21] Appl. No.: 145,920

[22] Filed: Jan. 20, 1988

[51] Int. Cl.$^5$ .................. C11D 7/30; C11D 7/50; C23G 5/028

[52] U.S. Cl. .................. 252/171; 134/12; 134/31; 134/38; 134/40; 134/42; 252/153; 252/162; 252/172; 252/364; 252/DIG. 9

[58] Field of Search ............... 252/171, 172, 153, 162, 252/DIG. 9, 364; 134/12, 31, 38, 40, 42

[56] References Cited

U.S. PATENT DOCUMENTS

3,904,542  9/1975  Reusser .................. 252/171
3,936,387  2/1976  Reusser .................. 252/171

*Primary Examiner*—Linda Skaling
*Attorney, Agent, or Firm*—James E. Shipley

[57] ABSTRACT

Azeotropic mixtures of 1,1-dichloro-1-fluoroethane (HCFC-141b) with methanol or ethanol, the azeotropic mixtures being useful in solvent cleaning applications.

18 Claims, No Drawings

AZEOTROPIC COMPOSITIONS OF 1,1-DICHLORO-1-FLUOROETHANE AND METHANOL/ETHANOL

BACKGROUND OF THE INVENTION

As modern electronic circuit boards evolve toward increased circuit and component densities, thorough cleaning of the boards after soldering becomes more important. Current industrial processes for soldering electronic components to circuit boards involve coating the entire circuit side of the board with a flux and thereafter passing this coated side of the board over preheaters and through molten solder. The flux cleans the conductive metal parts and promotes adhesion of the solder. Commonly used fluxes consist, for the most part, of rosin used alone or with activating additives such as amine hydrochlorides or oxalic acid derivatives.

After soldering, which thermally degrades part of the rosin, the flux and flux residues are often removed from the board with an organic solvent. The requirements of such a solvent are stringent: a solvent should have a low boiling point, have low toxicity and exhibit high solvent power so that flux and flux residues can be removed without damage to the substrate being cleaned.

Flammability and solvent power characteristics can often be adjusted by preparing mixtures of solvents; mixtures, however, are often unsatisfactory because they fractionate to an undesirable degree if they are boiled. Such mixtures also fractionate during recovery, making it difficult to reuse a solvent mixture with the original composition without reformulation.

On the other hand, azeotropic mixtures, with their constant boiling and constant composition characteristics, have been found to be very useful. Azeotropic mixtures exhibit either a maximum or minimum boiling point and do not fractionate upon boiling. These characteristics are also important in the use of the solvent compositions to remove solder fluxes and flux residues from printed circuit boards. Preferential evaporation of the more volatile components of the solvent mixtures, which would be the case if they were not azeotropes, or azeotrope-like, would result in mixtures with changed compositions which may have less desirable properties, such as lower solvency for rosin fluxes, less inertness toward the circuit board electrical components and increased flammability. Azeotropes or azeotrope-like compositions are also desirable in vapor degreasing operations where redistilled material is usually used for final rinse-cleaning. Thus, the vapor defluxing as well as the degreasing system acts as a still. Unless the solvent composition exhibits a constant boiling point, i.e., is an azeotrope or is azeotrope-like, fractionation will occur and undesirable solvent distribution may act to upset the safety and effectiveness of the cleaning operation.

A number of fluorocarbon based azeotropic compositions have been discovered and in some cases used as solvents for the removal of solder fluxes and flux residues from printed circuit boards and for miscellaneous vapor degreasing applications. Unfortunately, as recognized in the art, it is not possible to predict the formation of azeotropes and this obviously complicates the search for new azeotropic systems which have application in the field. Nevertheless, there is a constant effort in the art to discover new azeotropes or azeotrope-like systems which have desirable solvency characteristics and particularly a greater versatility of solvency power.

SUMMARY OF THE INVENTION

According to the present invention, an azeotrope or azeotrope-like composition has been discovered comprising an admixture of effective amounts of 1,1-dichloro-1-fluoroethane and an alcohol selected from the group consisting of methanol and ethanol and, more specifically, an admixture of about 94–98 weight percent 1,1-dichloro-1-fluoroethane and about 2–6 weight percent methanol or about 97–99 weight percent 1,1-dichloro-1-fluoroethane and about 1–3 weight percent ethanol.

The present invention provides azeotropic compositions which are well suited for solvent cleaning applications.

DETAILED DESCRIPTION OF THE INVENTION

The compositions of the instant invention comprise admixtures of effective amounts of 1,1-dichloro-1-fluoroethane ($CH_3CFCl_2$, boiling point 32.2° C.) with an alcohol selected from the group consisting of methanol and ethanol to form an azeotrope or azeotrope-like mixture. The fluorinated material is known as HCFC-141b in the nomenclature conventional to the chlorofluorocarbon field.

By azeotrope or azeotrope-like composition is meant a constant boiling liquid admixture of two or more substances which admixture behaves like a single substance in that the vapor produced by partial evaporation or distillation has substantially the same composition as does the liquid, i.e., the admixture distills without a substantial change in composition. Constant boiling compositions characterized as azeotropes or azeotrope-like exhibit either a maximum or minimum boiling point as compared with that of nonazeotropic mixtures.

By effective amount is meant the amount of each component of the admixture of the instant invention which, when combined, results in the formation of the azeotrope or azeotrope-like composition of the instant invention.

It is possible to "fingerprint", in effect, a constant boiling admixture, which may appear under varying guises depending on the conditions chosen, by any of several criteria:

The composition can be defined as an azeotrope of A and B, since the very term "azeotrope" is at once both definitive and limitative, requiring that effective amounts of A and B form this unique composition of matter which is a constant boiling admixture.

It is well known by those who are skilled in the art that at differing pressures, the composition of a given azeotrope will vary, at least to some degree, and changes in distillation pressures also change, at least to some degree, the distillation temperatures. Thus, an azeotrope of A and B represents a unique type of relationship but with a variable composition depending upon temperature and/or pressure. Therefore, compositional ranges, rather than fixed compositions, are often used to define azeotropes.

Or, the composition can be defined as a particular weight percent relationship or mol percent relationship of A and B, while recognizing that such specific values point out only one particular such relationship and that, in actuality, a series of such relationships represented by A and B actually exist for a given azeotrope, varied by influence of distillative conditions of temperature and pressure.

Or, recognizing that the azeotrope A and B does represent just such a series of relationships, the azeotropic series represented by A and B can be characterized by defining the composition as an azeotrope characterized by a boiling point at a given pressure, thus giving identifying characteristics without unduly limiting the scope of the invention by a specific numerical composition, which is limited by and is only as accurate as the analytical equipment available.

Binary mixtures of 94–98 weight percent HCFC-141b and 2–6 weight percent methanol are characterized as azeotropes or azeotrope-like in that mixtures within this range exhibit a substantially constant boiling point. Being substantially constant boiling, the mixtures do not tend to fractionate to any great extent upon evaporation. After evaporation, only a small difference exists between the composition of the vapor and the composition of the initial liquid phase. This difference is so small that the compositions of the vapor and liquid phases are considered substantially identical. Accordingly, any mixture within this range exhibits properties which are characteristic of a true binary azeotrope. The binary composition consisting of about 96.2 weight percent HCFC-141b and 3.8 weight percent methanol has been established, within the accuracy of the fractional distillation method, as a true binary azeotrope, boiling at about 30.0° C. at substantially atmospheric pressure and is a preferred azeotrope or azeotrope-like composition of the instant invention.

Also, according to the instant invention, binary mixtures of 97–99 weight percent HCFC-141b and 1–3 weight percent ethanol are characterized as an azeotrope or azeotrope-like in that mixtures within this range exhibit a substantially constant boiling point. Being substantially constant boiling, the mixtures do not tend to fractionate to any great extent upon evaporation. After evaporation, only a small difference exists between the composition of the vapor and the composition of the initial liquid phase. This difference is so small that the compositions of the vapor and liquid phases are considered substantially identical. Accordingly, any mixture within this range exhibits properties which are characteristic of a true binary azeotrope. The binary composition consisting of about 98.6 weight percent HCFC-141b and 1.4 weight percent ethanol has been established, within the accuracy of the fractional distillation method, as a true binary azeotrope, boiling at about 32° C. at substantially atmospheric pressure and is a preferred azeotrope or azeotrope-like composition of the instant invention.

The azeotrope of the present invention permits easy recovery and reuse of the solvent from vapor defluxing and degreasing operations because of its azeotropic nature. As an example, the azeotropic mixture of this invention can be used in cleaning processes such as is described in U.S. Pat. No. 3,881,949, which is incorporated herein by reference.

The azeotropes of the instant invention can be prepared by any convenient method including mixing or combining, by other suitable methods, the desired amounts of the components. A preferred method is to weigh the desired amounts of each component and thereafter combine them in an appropriate container.

EXAMPLE 1

A distillation apparatus consisting of a flask and a total reflux condenser was used to determine the composition versus boiling temperature characteristics for these minimum boiling azeotropes, as follows: Pure HCFC-141b was placed in the flask and brought to boiling at atmospheric pressure and the temperatures of the boiling liquid and the vapor above the boiling liquid were recorded. Small quantities of the individual alcohol (methanol or ethanol) were added to the distillation apparatus. The distillation was allowed to re-equilibrate while boiling at total reflux for 30 minutes or less, and the temperatures of the boiling liquid and the vapor above the boiling liquid were noted for that particular mixture composition.

In both cases with each alcohol, when the mixture temperature reached the lowest value (temperature lower than the boiling points of either pure component), the temperature recorded was the boiling point of the true azeotrope at the azeotropic composition.

In order to verify the exact azeotropic compositions and temperatures, two mixtures of HCFC-141b and the individual alcohol (methanol or ethanol) were prepared with alcohol contents slightly higher and lower than the azeotropic composition. The mixtures were then boiled separately in a distillation apparatus consisting of a packed column which contained approximately 24 theoretical plates. Minimum boiling azeotropes were achieved with both mixtures at the top of the column for both systems. Head temperatures were corrected to 760 mm Hg pressure. Azeotropic compositions were determined by gas chromatography.

EXAMPLE 2

A single sided circuit board was coated with activated rosin flux and soldered by passing the board over a preheater to obtain a top side board temperature of approximately 200° F. and then through 500° F. molten solder. The soldered board was defluxed with an azeotropic mixture of 96.2 weight percent HCFC-141b and 3.8 weight percent methanol by suspending it, first, for three minutes in the boiling sump, then, one minute in the rinse sump, and, thereafter, for one minute in the solvent vapor above the boiling sump. The board thus cleaned had no visible residue remaining on it.

We claim:

1. Azeotrope-like compositions consisting essentially of 1,1-dichloro-1-fluoroethane and methanol which boil at about 30.0° C. at substantially atmospheric pressure.

2. Azeotrope-like compositions consisting essentially of from about 94 to about 98 weight percent 1,1-dichloro-1-fluoroethane and from about 6 to about 2 weight percent methanol.

3. The azeotrope or azeotrope-like composition of claim 2 wherein the composition is about 96.2 weight percent 1,1-dichloro-1-fluoroethane and about 3.8 weight percent methanol.

4. Azeotrope-like compositions consisting essentially of 1,1-dichloro-1-fluoroethane and ethanol wherein said compositions have a boiling point of about 32.0° C. at substantially atmospheric pressure.

5. Azeotrope-like compositions consisting essentially of from about 97 to about 99 weight percent 1,1-dichloro-1-fluoroethane and from about 3 to about 1 weight percent ethanol.

6. Azeotrope-like compositions according to claim 5 consisting essentially of about 98.6 weight percent 1,1-dichloro-1-fluoroethane and about 1.4 weight percent ethanol.

7. The method of cleaning a solid surface which comprises treating said surface with an azeotrope-like composition as defined in claim 6.

8. The method of cleaning a solid surface which comprises treating said surface with an azeotrope-like composition as defined in claim 2.

9. The method of cleaning a solid surface which comprises treating said surface with an azeotrope-like composition as defined in claim 4.

10. The method of cleaning a solid surface which comprises treating said surface with an azeotrope-like composition as defined in claim 5.

11. The method of claim 7 wherein the solid surface is a printed circuit board contaminated with flux and flux residues.

12. The method of claim 8 wherein the solid surface is a printed circuit board contaminated with flux and flux residues.

13. The method of claim 7 wherein the solid surface is a metal.

14. The method of claim 8 wherein the solid surface is a metal.

15. The method of claim 9 wherein the solid surface is a printed circuit board contaminated with flux and flux residues.

16. The method of claim 10 wherein the solid surface is a printed circuit board contaminated with flux and flux residues.

17. The method of claim 9 wherein the solid surface is a metal.

18. The method of claim 10 wherein the solid surface is a metal.

* * * * *